(12) United States Patent
Liao et al.

(10) Patent No.: US 11,705,375 B2
(45) Date of Patent: Jul. 18, 2023

(54) ETCHING APPARATUS AND METHOD

(71) Applicant: Taiwan Semiconductor Manufacturing Co., Ltd., Hsinchu (TW)

(72) Inventors: Bo-Ting Liao, Hsinchu (TW); Yung-Chang Jen, Hsinchu (TW); Tsung-Yi Tseng, Hsinchu (TW); Shao Yong Chen, Hsinchu (TW); Hsi Chung Chen, Hsinchu (TW); Chih-Teng Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/461,737

(22) Filed: Aug. 30, 2021

(65) Prior Publication Data

US 2023/0062731 A1 Mar. 2, 2023

(51) Int. Cl.
*H01L 21/66* (2006.01)
*H01L 21/311* (2006.01)
*H01J 37/32* (2006.01)

(52) U.S. Cl.
CPC ........ *H01L 22/26* (2013.01); *H01J 37/32449* (2013.01); *H01J 37/32513* (2013.01); *H01J 37/32935* (2013.01); *H01L 21/31116* (2013.01); *H01L 21/31144* (2013.01); *H01J 2237/334* (2013.01)

(58) Field of Classification Search
None
See application file for complete search history.

(56) References Cited

U.S. PATENT DOCUMENTS

| | | | | |
|---|---|---|---|---|
| 5,772,770 A | * | 6/1998 | Suda | H01J 37/32458 118/725 |
| 2009/0233449 A1 | * | 9/2009 | Lebouitz | H01L 21/67745 257/E21.483 |

* cited by examiner

*Primary Examiner* — Roberts P Culbert
(74) *Attorney, Agent, or Firm* — Seed IP Law Group

(57) ABSTRACT

A method includes forming an inner chamber in a process chamber of a plasma processing apparatus, the inner chamber having smaller volume than the process chamber. At least one gas is introduced into the inner chamber, and flow of the at least one gas into the inner chamber is measured. The flow of the at least one gas is adjusted to a desired rate, and a wafer is processed by the at least one gas at the desired rate while the inner chamber is not formed.

20 Claims, 11 Drawing Sheets

ETCHING APPARATUS AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
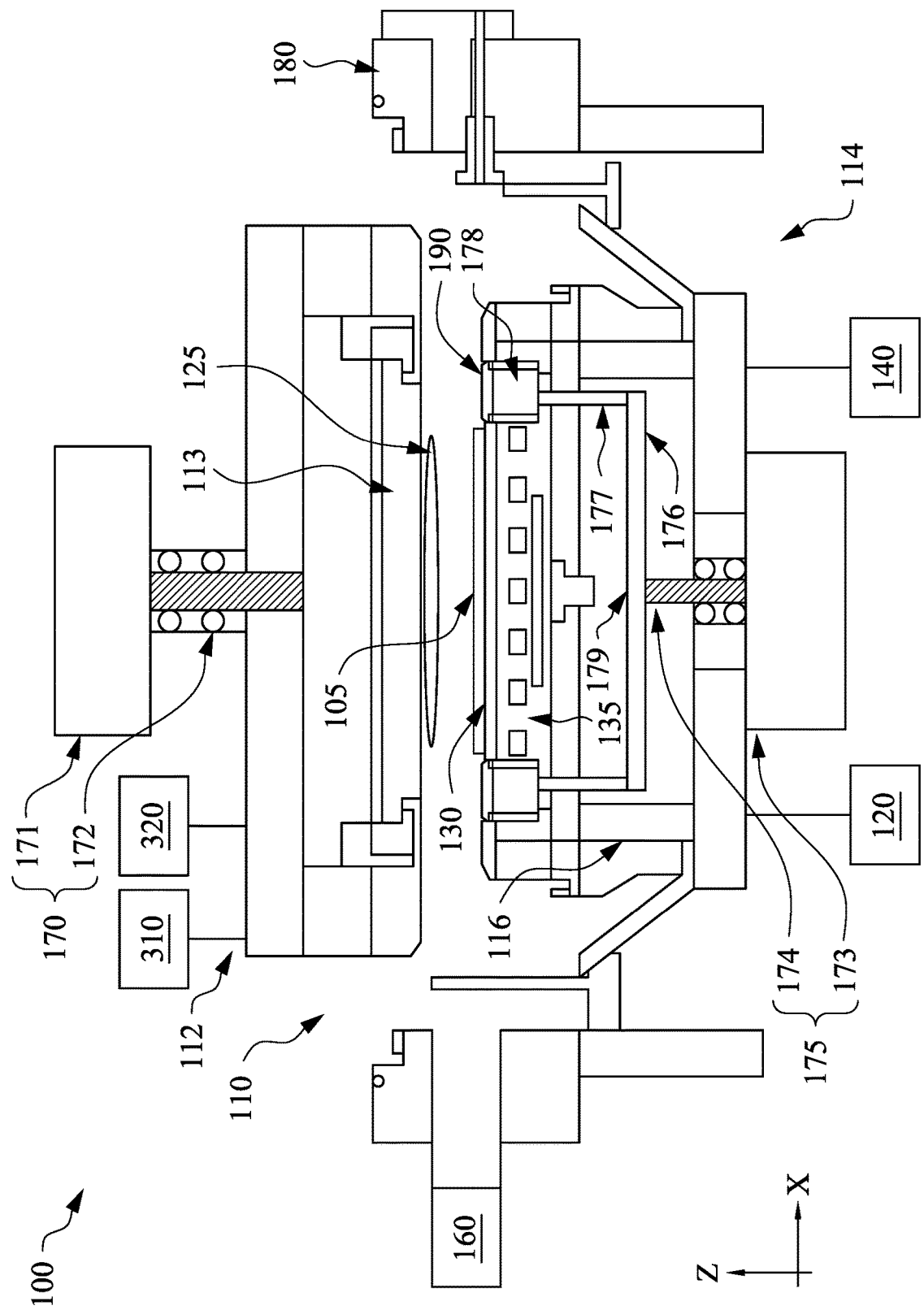
FIGS. 1-2 are views of an etching apparatus according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

Semiconductor fabrication generally involves the formation of electronic circuits by performing multiple depositions, etchings, annealings, and/or implantations of material layers, whereby a stack structure including many semiconductor devices and interconnects between is formed. Dimension scaling (down) is one technique employed to fit ever greater numbers of semiconductor devices in the same area. However, dimension scaling is increasingly difficult in advanced technology nodes. Etching techniques employed by etchers for removing portions of a material layer(s) according to a pattern use ever lower etching gas flow rates to achieve smaller feature sizes. Minimum feature dimension (or, "critical dimension (CD)") and feature profile are both improved by accurate gas flow. Insufficient gas flow, for example, may correlate with unsatisfactory CD and increased defect count.

Etching gas flow may be verified by in-situ and/or ex-situ gas flow verification apparatuses. However, for certain processes that use small gas flow rates (e.g., 1 sccm or less), a large error rate associated with the in-situ verification apparatus decreases viability of using the in-situ verification apparatus at the etcher. The ex-situ gas flow verification apparatus has a smaller chamber volume, which aids in accurate measurement of etching gas flow rate, such that small gas flow rate measurement accuracy is viable in the ex-situ gas flow verification apparatus. However, gas delivery behavior into the etcher may be difficult to correlate with gas delivery behavior into the ex-situ gas flow verification apparatus.

In embodiments of the present disclosure, etcher chamber volume is confined by moving parts, which leads to improved in-situ small gas flow verification due to reduced chamber volume. Real-time optical emission spectroscopy (OES) and off-line etching rate measurement are enabled, as well. These innovations may be extended to the entire plasma etcher operation. Small gas flow verification for minimum feature dimension plasma processes are implemented. Both measurement of gas flow behavior into the etcher and higher flow control accuracy are achieved, enabling improved etcher tool matching and wafer process stability.

FIG. 1 is a schematic view of an etching apparatus 100, according to various embodiments of the disclosure. In some embodiments, the etching apparatus 100 is configured for performing etching and deposition. As shown in FIG. 1, the etching apparatus 100 includes a process chamber 110, and a source of radio frequency (RF) power 120 configured to provide RF power in the process chamber 110. The etching apparatus 100 also includes an electrostatic chuck 130 within the process chamber 110, and the electrostatic chuck 130 is configured to receive a wafer 105. The etching apparatus 100 also includes a chuck electrode 135, and a source of direct current (DC) power 140 connected to the chuck electrode 135. The source of DC power 140 is configured to provide power to the chuck electrode 135. The etching apparatus 100 also includes a gas source 310 configured to introduce process and/or carrier gases into the process chamber 110. The etching apparatus 100 further includes a flow verification unit 320 configured to measure and/or verify flow rate of the process and/or carrier gases into the process chamber 110. In some embodiments, the flow verification unit 320 is a manometer. In some embodiments, the flow verification unit 320 is in fluidic communication with the process chamber 110.

In some embodiments, the etching apparatus 100 is a plasma etching apparatus. In some embodiments, the etching apparatus 100 is any plasma etching or dry etching tool that produces a plasma from a process gas, typically oxygen, chlorine-bearing gas, or fluorine-bearing gas, and uses a radio frequency electric field. In some embodiments, the etching apparatus 100 is an ion-beam etcher, reactive ion etcher, or the like. In other embodiments, instead of an etching apparatus, a plasma deposition apparatus is used, such as a plasma-enhanced atomic layer deposition (PEALD) apparatus or the like. The plasma etching apparatus and the plasma deposition apparatus may be collectively referred to as plasma processing apparatuses.

In some embodiments, the wafer 105 includes a single crystalline semiconductor layer on at least its surface. In some embodiments, the wafer 105 includes a single crystalline semiconductor material such as, but not limited to Si, Ge, SiGe, GaAs, InSb, GaP, GaSb, InAlAs, InGaAs, GaSbP, GaAsSb, and InP. In some embodiments, the wafer 105 is made of Si. In some embodiments, the wafer 105 is a silicon wafer. In some embodiments, the wafer 105 is a semiconductor-on-insulator substrate fabricated using separation by implantation of oxygen (SIMOX), wafer bonding, and/or other suitable methods, such as a silicon-on-insulator (SOI) substrate, a silicon germanium-on-insulator (SGOI) substrate, or a germanium-on-insulator (GOI) substrate. In some embodiments, the wafer 105 is a Si wafer having a mirror polished surface on one side or both sides. In some embodiments, the wafer 105 includes one or more integrated circuit (IC) dies in an intermediate (unfinished) stage of fabrication, such that plasma etching or deposition is performed on at least a topmost layer of each of the IC dies by the etching apparatus 100.

In some embodiments, the process chamber 110 includes an upper portion 112 and a lower portion 114, which may include at least one conductive material, such as aluminum, as well as other non-conductive materials. The upper portion 112 includes an upper electrode 113, in some embodiments. In some embodiments, the lower portion 114 includes an insulating ceramic frame 116 and includes the electrostatic chuck 130 within the insulating ceramic frame 116. For example, the electrostatic chuck 130 is disposed within the insulating ceramic frame 116 within the lower portion 114 of the process chamber 110, as shown in FIG. 1. In some embodiments, the electrostatic chuck 130 includes a conductive sheet, which serves as the chuck electrode 135. As shown in FIG. 1, the chuck electrode 135 is connected to the source of DC power 140. When a DC voltage from the source of DC power 140 is applied to the chuck electrode 135 of the electrostatic chuck 130 having the wafer 105 disposed thereon, a Coulomb force is generated between the wafer 105 and the chuck electrode 135. The Coulomb force attracts and holds the wafer 105 on the electrostatic chuck 130 until the application of the DC voltage from the source of DC power 140 is discontinued.

In some embodiments, in order to improve the heat transfer between the wafer 105 and the electrostatic chuck 130, one or more gases, such as He or Ar, is introduced between the wafer 105 and the electrostatic chuck 130 by the gas source 310. In some embodiments, the gas dissipates heat generated between the wafer 105 and the electrostatic chuck 130 during the application of the DC voltage.

As illustrated in FIG. 1, the etching apparatus 100 also includes a pump 160 connected to the process chamber 110. The pump 160 is configured to provide a vacuum or maintain a certain gas pressure within the process chamber 110. In some embodiments, the pressure within the process chamber 110 is maintained by the combination of the gas or gases being introduced by the gas source 310 and a level of pumping performed by the pump 160. In some embodiments, the pressure within the process chamber 110 is maintained solely by pumping with the pump 160.

In some embodiments, the source of RF power 120 is turned on to apply a plasma 125 for plasma etching operations. The source of RF power 120 may be configured to generate an RF signal operating at a set frequency (e.g., 13.56 MHz), which transfers energy from the source of RF power 120 to the gas within the processing chamber 110. When sufficient power has been delivered to the gas, a plasma is ignited. In some embodiments, the power applied during the etching operations ranges from about 200 watts to about 700 watts. In some embodiments, application of an RF pulse occurs for a duration of about 10 seconds to about 60 seconds.

In some embodiments, the etching apparatus 100 further includes a chamber confinement assembly including upper and lower actuators 170, 175, lift plate 176, and sealing ring 178. The chamber confinement assembly is configured to form an inner chamber 115 having reduced volume relative to the process chamber 110 to improve measurement and/or verification accuracy by the flow verification unit 320, which is described in further detail with reference to FIG. 2.

In some embodiments, the upper actuator 170 is configured to shift position of the upper electrode 113 with high precision over a range of about 0 mm to about 30 mm. In some embodiments, the precision over the range of the upper actuator 170 is in a range of about 0 mm to about 0.02 mm. In some embodiments, the upper actuator 170 includes a servo motor 171 and a ball screw 172. The ball screw 172 is attached to the upper portion 112 including the upper electrode 113. The servo motor 171 controls extension and retraction of the ball screw 172 to shift the position of the upper electrode 113 in the vertical direction, which is indicated by an axis "Z" in FIG. 1. The vertical direction may be substantially perpendicular to a major surface of the upper electrode 113 and a major surface of the electrostatic chuck 130.

In some embodiments, the lower actuator 175 is configured to shift position of the lift plate 176 and sealing ring 178 with high precision over a range of about 0 mm to about 20 mm. In some embodiments, the precision over the range of the lower actuator 175 is in a range of about 0 mm to about 0.02 mm. In some embodiments, the lower actuator 175 includes a servo motor 173 and a ball screw 174. The ball screw 174 is attached to the lift plate 176, which is in turn attached to the sealing ring 178. The servo motor 173 controls extension and retraction of the ball screw 174 to shift the position of the sealing ring 178 in the vertical direction (e.g., the Z axis of FIG. 1).

In some embodiments, the sealing ring 178 is substantially annular, and surrounds the electrostatic chuck 130. The sealing ring 178 may have thickness in the Z direction of at least about 20 mm. In some embodiments, the sealing ring 178 is a focus ring or edge ring. In some embodiments, the sealing ring 178 is separate from a focus ring or edge ring, for example, laterally surrounding the focus or edge ring or laterally surrounded by the focus ring or edge ring. In embodiments in which a separate focus or edge ring is present, the focus ring may be utilized for achieving a more uniform plasma distribution over the entire surface of the wafer 105 and for restricting the distribution of the plasma cloud to only the wafer surface area. In order to survive high temperature and hostile environments, the focus ring is frequently constructed of a ceramic material such as quartz. In some embodiments, the sealing ring 178 is constructed of ceramic material such as quartz, or other suitable material. In some embodiments, the sealing ring 178 includes a different material from the focus ring.

In some embodiments, a protective coating 190 is present on at least an upper surface of the sealing ring 178 facing the plasma 125. In some embodiments, the protective coating 190 further covers at least an inner sidewall of the sealing ring 178 facing the plasma 125 (see FIG. 3B). In some embodiments, the protective coating 190 further covers an outer sidewall of the sealing ring 178 facing away from the plasma 125 (see FIG. 3B). The coating 190 may be formed on the respective surfaces of the sealing ring 178 as a thin film coating using another coating apparatus and advantageously prior to the installation of the process kit within the etching apparatus 100. The coating apparatus used to form the coating 190 may be a PVD, physical vapor deposition, or a CVD, chemical vapor deposition apparatus. The coating 190 may be a thin film coating and may have a thickness less than 20 microns, but other thicknesses may be used in other embodiments. In some embodiments, the coating 190 may include thickness of 5 microns. In some embodiments, the coating 190 may be an yttria coating (e.g., Y2O3) or a sapphire-like coating formed using PVD or CVD or other suitable thin film deposition processes.

In some embodiments, the lift plate 176 includes a horizontal base portion 179 and vertical extension(s) 177. In some embodiments, a center of the base portion 179 is substantially aligned with a center of the sealing ring 178 along the Z direction. In some embodiments, the base portion 179 is substantially annular, and has diameter less than outer diameter of the sealing ring 178 and greater than inner diameter of the sealing ring 178. In some embodiments, the inner diameter of the sealing ring 178 is separated from the electrostatic chuck 130 by less than about 0.1 mm. In some embodiments, the inner diameter of the sealing ring 178 is substantially the same as the outer diameter of the electrostatic chuck 130, such that the sealing ring 178 sits flush with the electrostatic chuck 130. Separating the electrostatic chuck 130 from the sealing ring 178 by more than about 0.1 mm may lead to inaccurate measurement of gas flow by the flow verification unit 320. In some other embodiments, the sealing ring 178 and the electrostatic chuck 130 may be separated by intervening structure, e.g., the focus ring or edge ring, such that a separation greater than about 0.1 mm, or even greater than about 20 mm, is desirable. The outer diameter of the sealing ring 178 may be greater than the inner diameter of the sealing ring 178 by a value in a range of about 5 mm to about 30 mm. The difference of the outer and inner diameters of the sealing ring 178 is a thickness (in the X direction) of the sealing ring 178. The thickness being less than about 5 mm may lead to insufficient ability to form a seal when reducing the chamber size to that of the inner chamber 115, which may further contribute to inaccuracy in measurement of gas flow by the flow verification unit 320.

In some embodiments, the center of the base portion 179 is in physical contact with the ball screw 174. In some embodiments, the vertical extensions 177 are positioned substantially at the periphery, e.g., the outer edge, of the base portion 179. In some embodiments, the vertical extension 177 is a single ring structure which extends vertically upward from the base portion 179. In some embodiments, the vertical extensions 177 include at least three pins or pegs that extend vertically from the base portion 179 to contact the sealing ring 178. The vertical extensions 177 have a first end in contact with (e.g., monolithically formed with) the base plate 176, and a second end in contact with the sealing ring 178. In some embodiments, the vertical extensions 177 extend through the ceramic frame 116 and the chuck electrode 135.

In some embodiments, the vertical extensions 177 have height in the Z direction, and thickness in the radial direction from the center of the base portion 179, e.g., the X direction for the cross-sectional depiction of the vertical extensions 177 shown in FIG. 1. In some embodiments, a ratio of the thickness of the vertical extensions 177 to the thickness of the sealing ring 178 is in a range of about 0.1 to 1 (e.g., the thicknesses are the same). The thickness of the vertical extensions 177 being less than about 0.1 times the thickness of the sealing ring 178 may lead to insufficient strength of the vertical extensions 177, such that the vertical extensions 177 may be damaged, e.g., by warping or breaking.

In FIG. 1, the chamber confinement assembly including the upper and lower actuators 170, 175, lift plate 176, and sealing ring 178 is in a retracted position. In the retracted position, the upper surface of the sealing ring 178 may be substantially flush with an upper surface of the electrostatic chuck 130, and the wafer 105 is generally exposed to the process chamber 110 in full. The ball screws 172, 174 may be fully retracted. In some embodiments, in the retracted position, the vertical extensions 177 are disengaged (e.g., separated by a distance) from the sealing ring 178. In some embodiments, the vertical extensions 177 are in physical contact with the sealing ring 178 in the retracted position.

Figure 2:
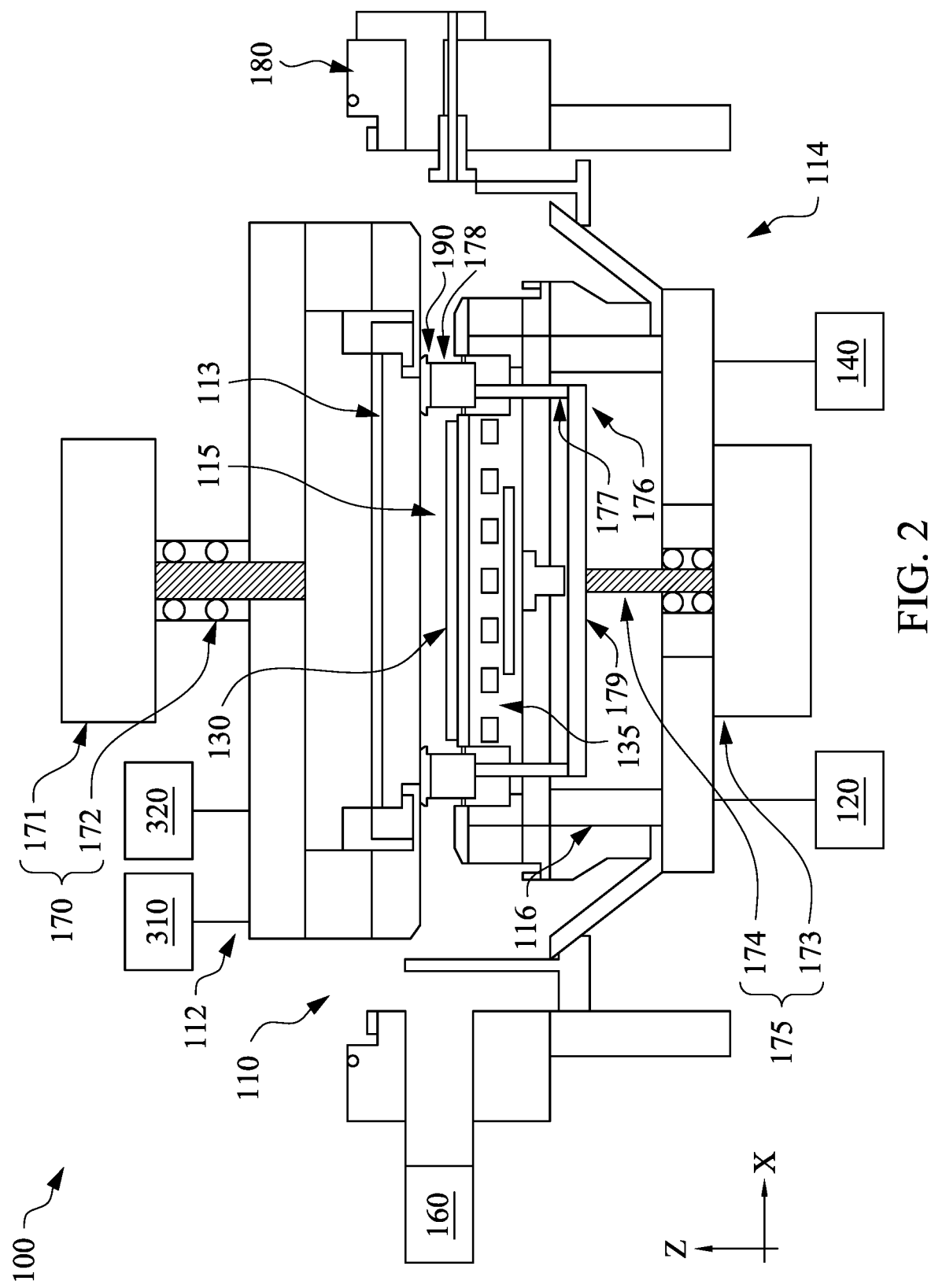

In an extended position, shown in FIG. 2, the upper surface of the sealing ring 178 may be in physical contact with a lower surface of the upper electrode 113. As such, the inner chamber 115 is formed when the upper and lower actuators 170, 175, the lift plate 176, and the sealing ring 178 are in the extended position, with sidewalls of the inner chamber 115 including the upper surface of the electrostatic chuck 130, inner sidewall(s) of the sealing ring 178, and lower sidewall of the upper electrode 113. The ball screws 172, 174 may be fully extended. In some embodiments, in the extended position, the vertical extensions 177 are engaged with (e.g., in physical contact with) the sealing ring 178, and the ball screw 174 is engaged with the base portion 179. In some embodiments, as shown in FIG. 2, in the extended position, the protective coating 190 of the sealing ring 178 is in physical contact with the upper electrode 113. Forming the inner chamber 115 effectively cuts off as much as about 80% of volume of the process chamber 110, in some embodiments. The confined volume of the inner chamber 115 significantly improves small gas flow verification accuracy by the flow verification unit 320. In some embodiments, ratio of volume of the inner chamber 115 to volume of the process chamber is in a range of about 10% to about 50%. If the ratio is greater than about 50%, the increase in small gas flow verification accuracy may be insufficient to achieve acceptable etcher tool matching between actual small gas flow and measured small gas flow.

Figure 3A:
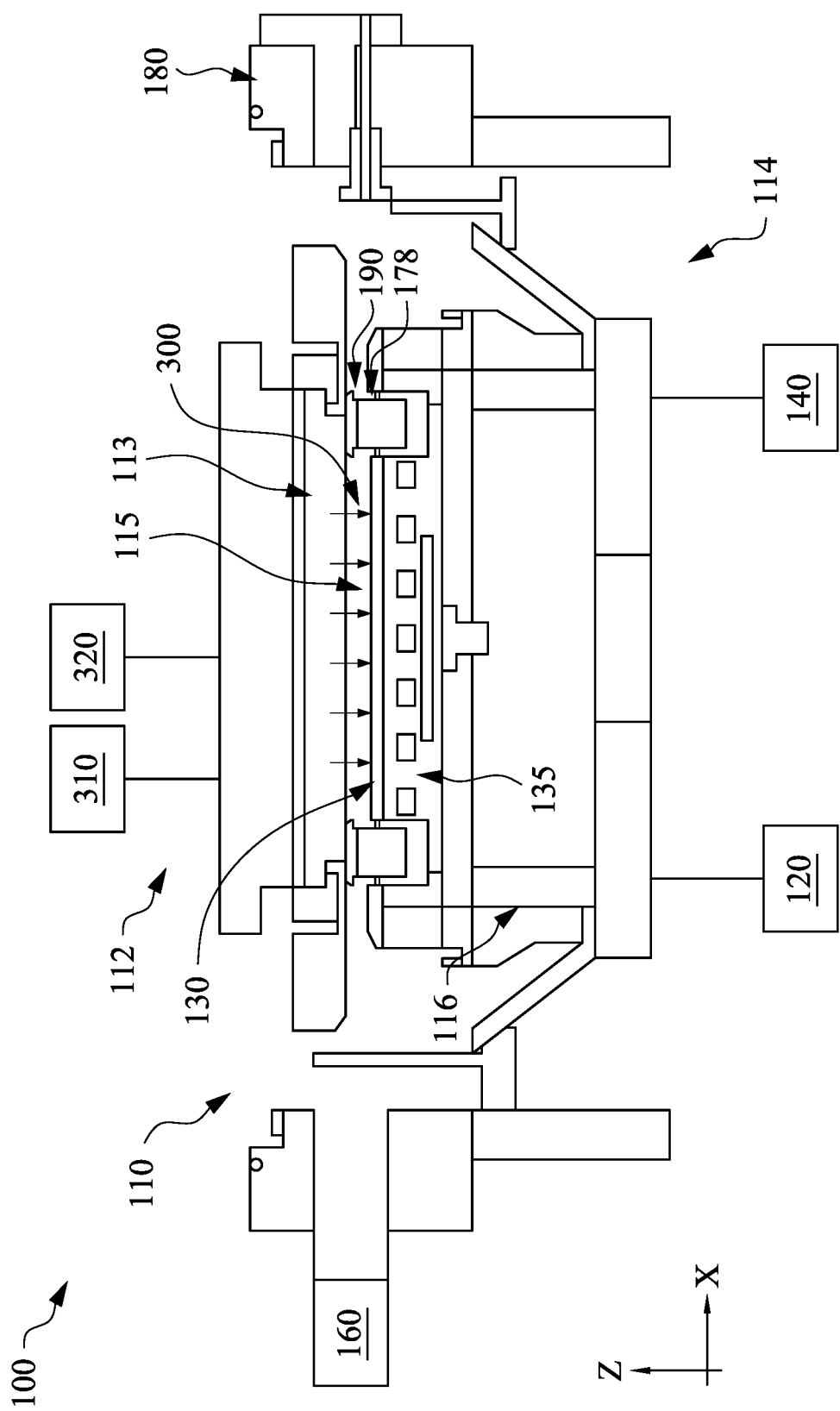
FIGS. 3A-3C are further views of an etching apparatus according to various aspects of the present disclosure.

It may be desirable to exhaust gas from the inner chamber 115 during, for example, measurement of gas flow into the inner chamber 115 (see, for example, FIG. 3A). As such, in some embodiments, at least one opening may be present in any of the sealing ring 178, the protective coating 190, the electrostatic chuck 130, the chuck electrode 135, the ceramic frame 116, or the upper electrode 113. In some embodiments, an opening in the sealing ring 178 is in fluidic communication with the inner chamber 115 and the process chamber 110. In some embodiments, the opening has diameter in a range of about 0.25 mm to about 2.5 mm. In some embodiments, the opening has cross-sectional area in a range of about 0.0625 mm$^2$ to about 6.25 mm$^2$. In some embodiments, the inner chamber 115 is fully sealed with no openings present in the sealing ring 178, the protective coating 190, the electrostatic chuck 130, the chuck electrode 135, the ceramic frame 116, or the upper electrode 113.

Further to FIG. 1, the etching apparatus 100 also includes a spectral and/or charge monitoring system 180. The spectral and/or charge monitoring system 180 is configured to monitor surface charge level. In some embodiments, continuous or periodic monitoring by the spectral and/or charge monitoring system 180 provides a user with a history or profile of the etching apparatus 100 throughout the etching apparatus's service life, or in some instances, any time period of the etching apparatus's service life. In some embodiments, the spectral and/or charge monitoring system 180 includes at least an optical emission spectrometer for performing optical emission spectroscopy (OES). In some embodiments, the sealing ring 178 is substantially transparent to allow analysis of gases inside the inner chamber 115 by the spectral and/or charge monitoring system 180, for example, during measurement of the gas flow during verification (FIG. 3A) or real-time detection of plasma generated inside the inner chamber 115 (FIG. 3B).

Figure 3B:
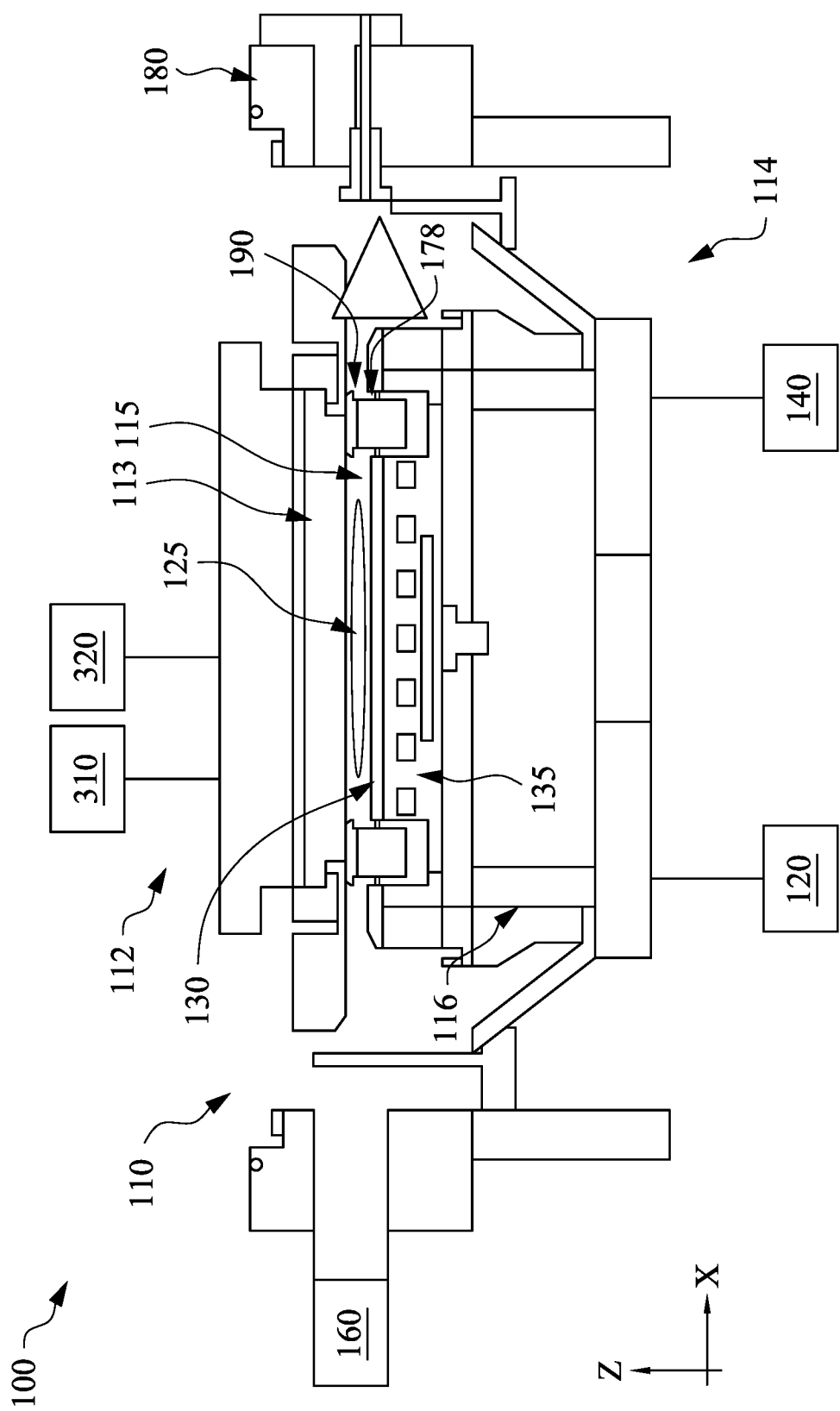
Figure 3C:
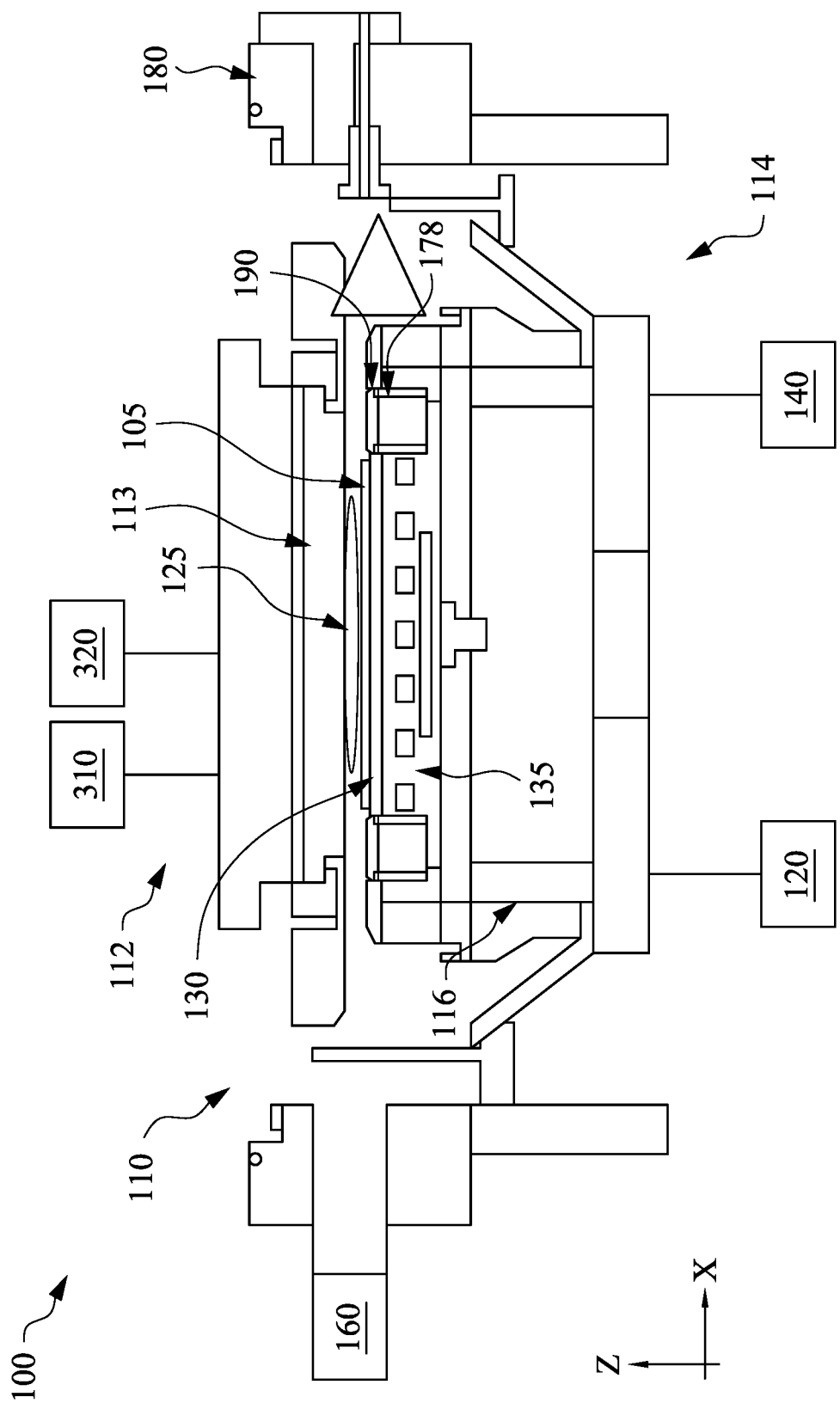
Figure 4A:
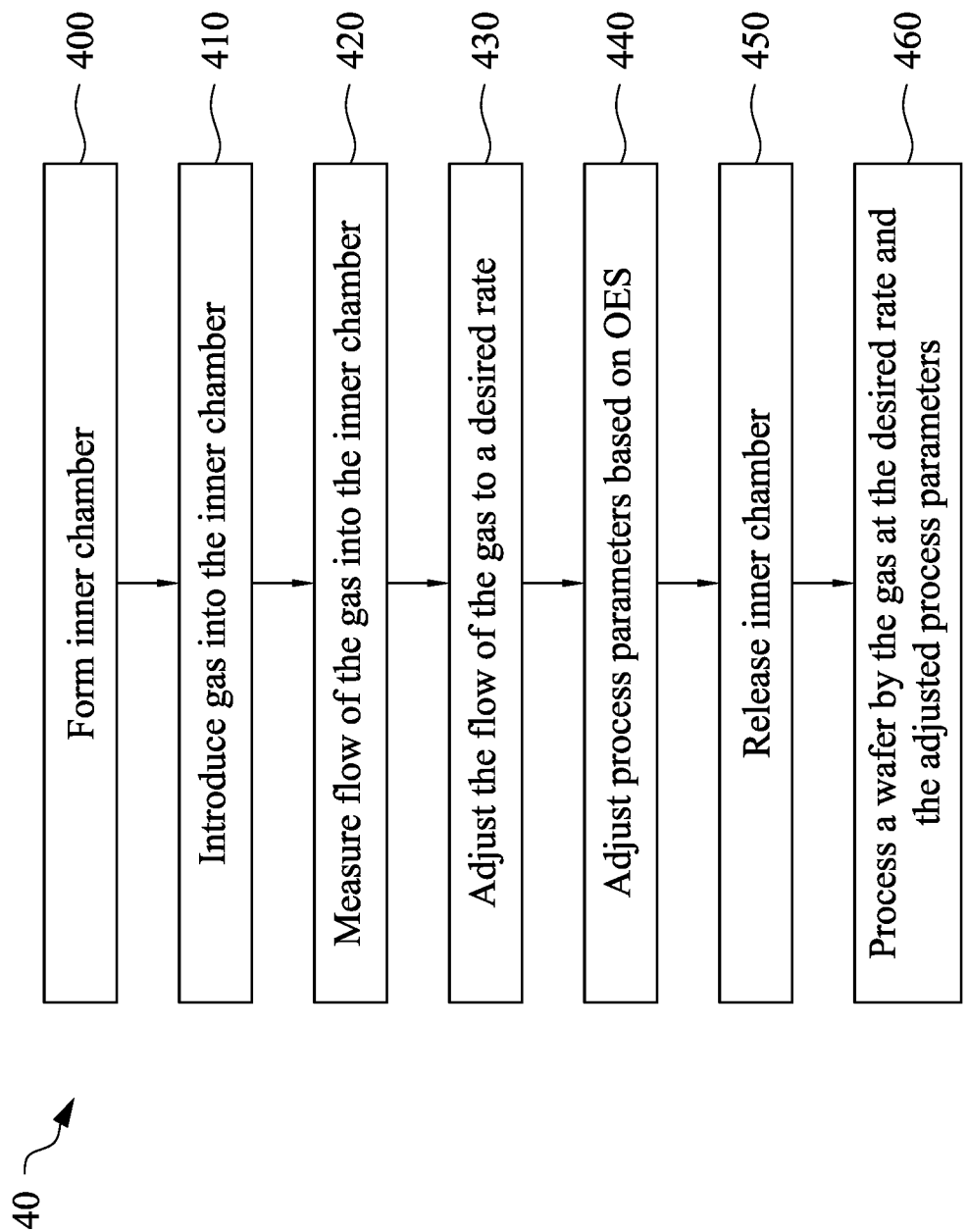
FIGS. 4A-4B are views illustrating a method of processing a wafer according to various aspects of the present disclosure.

FIGS. 3A-3C are views of the etching apparatus 100 during small gas flow verification (FIG. 3A), real-time detection of plasma generated inside the inner chamber 115 (FIG. 3B), and wafer etching by plasma with etching rate measurement and real-time detection inside the process chamber 110 (FIG. 3C). Some elements of the chamber confinement apparatus are not shown in FIGS. 3A-3C for ease of illustration. FIG. 4A illustrates a flow chart of operations for processing the wafer 105 using the etching apparatus 100 including the chamber confinement assembly. In some embodiments, order of the operations of FIG. 4A may be rearranged, some of the operations may be performed simultaneously, additional or fewer operations may be performed, or other reasonable alterations may be made.

In FIG. 3A, during small gas flow verification, a small gas flow 300 is introduced into the inner chamber 115 while the sealing ring 178 is in the extended position (refer to description corresponding to FIG. 2), corresponding to operations 400 and 410 of process 40 in FIG. 4A. In some embodiments, the small gas flow 300 is introduced by the gas source 310 in fluid communication with the inner chamber 115. In some embodiments, substantially no gas is introduced into regions of the process chamber 110 outside the inner chamber 115, such that substantially all gas introduced by the gas source 310 flows into the inner chamber 115. In some embodiments, the inner chamber 115 is substantially sealed, e.g., having substantially no exhaust path by which the gas may exit the inner chamber 115. In some embodiments, the gas source 310 may store and introduce any of a number of suitable process and/or carrier gases into the inner chamber 115. The gases may include NF3, O2, C4F8, C4F6, He, CH3F, H2, CO, Ar, or any other suitable process or carrier gas. In some embodiments, flow rate of the small gas flow 300 is less than about 1 sccm.

While the gas(es) are introduced to the inner chamber 115, the flow verification unit 320 measures flow of the gas(es) into the inner chamber 115, corresponding to operation 420 of the process 40 in FIG. 4A. In some embodiments, the flow verification unit 320 measures pressure of the gas in the inner chamber 115. In some embodiments, the flow verification unit 320 includes or has a data connection to a processing unit (not shown). In some embodiments, the processing unit receives at least two pressure measurements at different times during introduction of the gas(es) to the inner chamber 115.

Figure 4B:
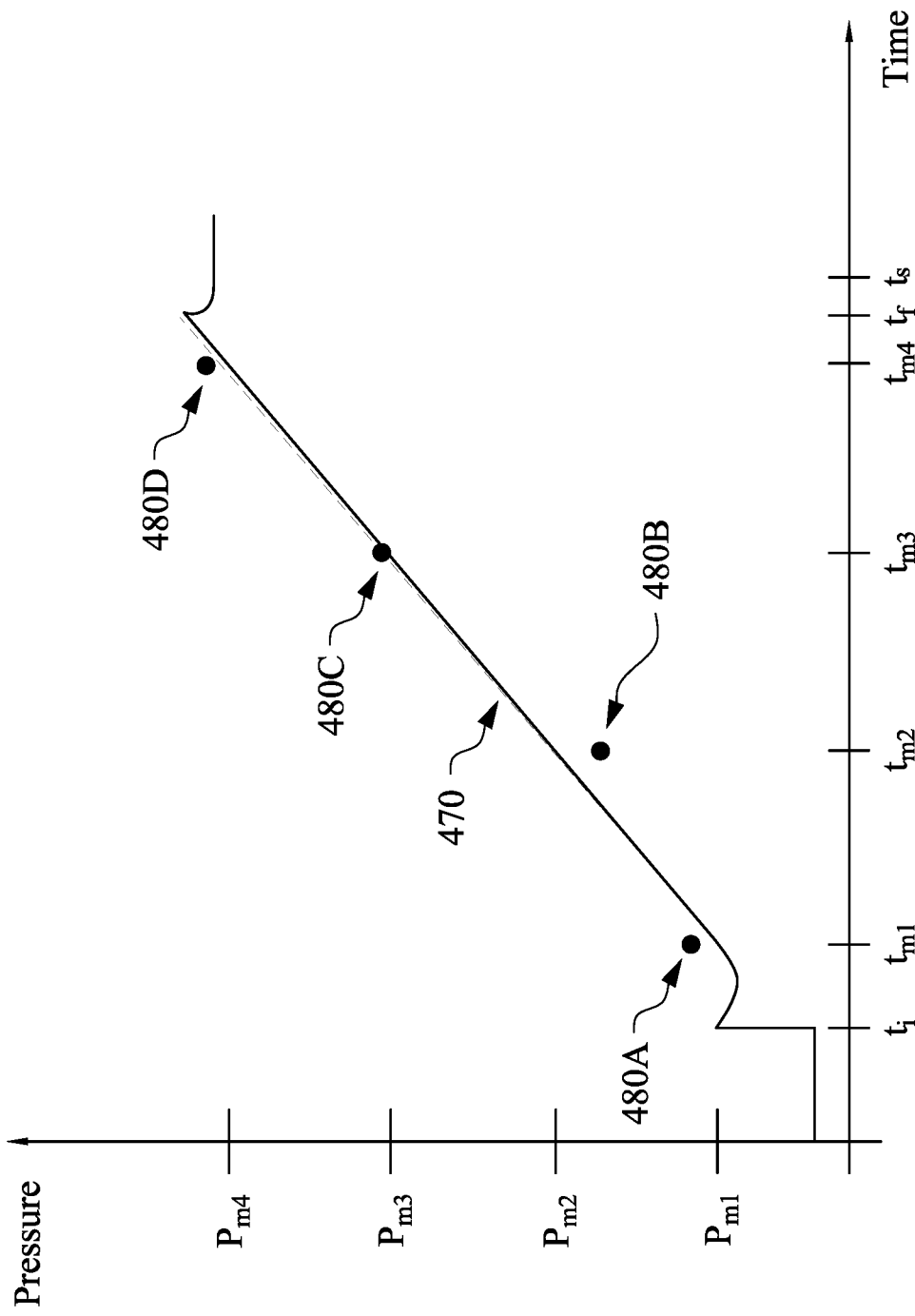

In some embodiments, the flow of the gas(es) is measured by a rate of rise calculation, which is illustrated in FIG. 4B. In some embodiments, the rate of rise calculation determines the flow of the gas(es) by averaging a change in pressure between the at least two pressure measurements over time between the at least two pressure measurements. In some embodiments, the gas(es) is introduced to the inner chamber 115 starting at an initial time $t_i$, and the flow of the gas(es) is stopped at a final time $t_f$. Prior to the initial time $t_i$, the inner chamber 115 may be sealed, and pressure in the inner chamber 115 may be reduced to substantially vacuum, or another suitable pressure higher than vacuum but low enough to allow for accurate flow measurement, e.g., less than about 100 kPa. After the final time $t_f$, the flow of the gas(es) is stopped, and the pressure in the inner chamber 115 settles to a settled pressure $P_s$. In some embodiments, time duration between the initial time $t_i$ and the final time $t_f$ is in a range of about 0.5 minutes to about 10 minutes.

Between the initial time $t_i$ and the final time $t_f$, corresponding to the dashed line 470 shown in FIG. 4B, the at least two pressure measurements may be made by the flow verification unit 320. For example, a first pressure $P_{m1}$ may be measured at first time $t_{m1}$ corresponding to the dot 480A, a second pressure $P_{m2}$ may be measured at second time $t_{m2}$ following the first time $t_{m1}$ corresponding to the dot 480B, a third pressure $P_{m3}$ may be measured at third time $t_{m3}$ following the second time $t_{m2}$ corresponding to the dot 480C, and a fourth pressure $P_{m4}$ may be measured at fourth time $t_{m4}$ following the third time $t_{m3}$ corresponding to the dot 480D. The flow may then be calculated based on the average rise in the pressure over the time passed, e.g., as slope of the dashed line 470, which may be fitted based on at least one of the dots 480A-480D. While four pressures $P_{m1}$-$P_{m4}$ are measured in the embodiment illustrated in FIG. 4B, fewer or more pressures may be measured, and the slope of the dashed line 470 may be calculated based on at least two of the pressures measured.

Based on the Ideal Gas Equation (or "Ideal Gas Law"), PV=nRT, the pressure in the inner chamber 115 may be temperature-dependent. As such, in addition to the pressure measurements described with reference to FIG. 4B, in some embodiments, temperature of the inner chamber 115 is also measured at the first through fourth times $t_{m1}$-$t_{m4}$. In some embodiments, the flow is calculated based on the first through fourth pressures $P_{m1}$-$P_{m4}$, the first through fourth times $t_{m1}$-$t_{m4}$ and first through fourth temperatures $T_{m1}$-$T_{m4}$ (not separately illustrated).

In the retracted position, the flow verification unit 320 is generally unable to measure the flow rate of less than about 1 sccm. In the extended position, with the inner chamber 115 formed, the flow verification unit 320 is able to measure the flow rate of less than about 1 sccm, and the measurement by the flow verification unit 320 has good accuracy (e.g., error rate within about +/−0.8%) due to as much as a five-fold reduction in effective chamber volume by use of the chamber confinement assembly. Based on the measurement by the flow verification unit 320, the flow rate of the gas(es) may be adjusted by the gas source 310 to a desired rate, corresponding to operation 430 of the process 40 in FIG. 4A. Due to the reduced volume of the inner chamber 115, time spent on performing the rate of rise test may be shortened, as time to evacuate the inner chamber 115 may be shorter, and time between introducing the gas(es) to the inner chamber 115 and reaching substantially linear pressure rise may also be shorter.

In FIG. 3B, plasma 125 is generated in the inner chamber 115 with the sealing ring 178 in the extended position (refer to description corresponding to FIG. 2). As shown in FIG. 3B, the plasma 125 may be generated while no wafer (e.g., the wafer 105) is present in the inner chamber 115. In some embodiments, the plasma 125 is generated in the inner chamber 115 with a wafer present. In some embodiments, the wafer in the inner chamber 115 during generation of the plasma 125 is a dummy wafer, a test wafer, a bare silicon wafer, or other suitable wafer for characterizing the plasma 125. Characterization of the plasma 125 and/or other conditions of the inner chamber 115 may be performed by the spectral and/or charge monitoring system 180. In some embodiments, the spectral and/or charge monitoring system 180 performs optical emission spectroscopy to measure an emission spectrum in the inner chamber 115 to characterize at least chemical and/or physical state of the plasma process. In some embodiments, the plasma 125 is generated in the inner chamber 115 while the flow rate of the gas(es) introduced by the gas source 310 is less than about 1 sccm. Based on the characterization by the spectral and/or charge monitoring system 180, adjusted process parameters including pressure, temperature, DC voltage, or other suitable process parameters, may be generated, corresponding to operation 440 of the process 40 in FIG. 4A.

In some embodiments, the sealing ring 178 is formed of a transparent material, such as quartz or glass, which allows for OES measurement through the sealing ring 178 while the sealing ring 178 is in the extended position. In some embodiments, the sealing ring 178 is formed of a base material that is opaque or semitransparent, and includes a port that is transparent and aligned with the spectral and/or charge monitoring system 180 to allow measurement of the emission spectrum of the plasma 125 by the spectral and/or charge monitoring system 180 through the port. In some embodiments, the port is or comprises quartz, glass, or other suitable transparent material that can withstand the harsh environment of the inner chamber 115 during formation of the plasma 125.

Figure 5A:
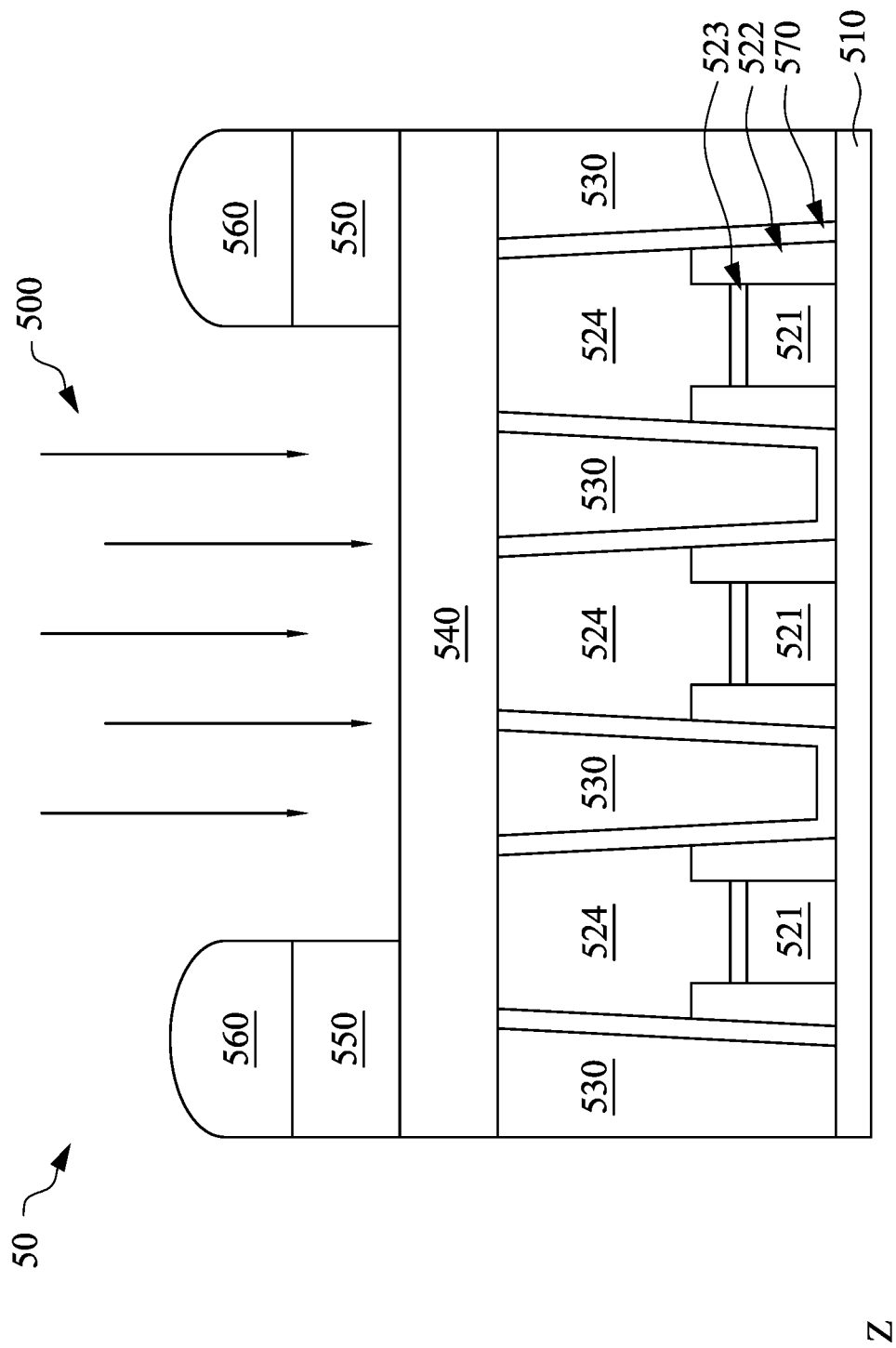
FIGS. 5A-6B are views illustrating an etching operation according to various aspects of the present disclosure.
Figure 5B:
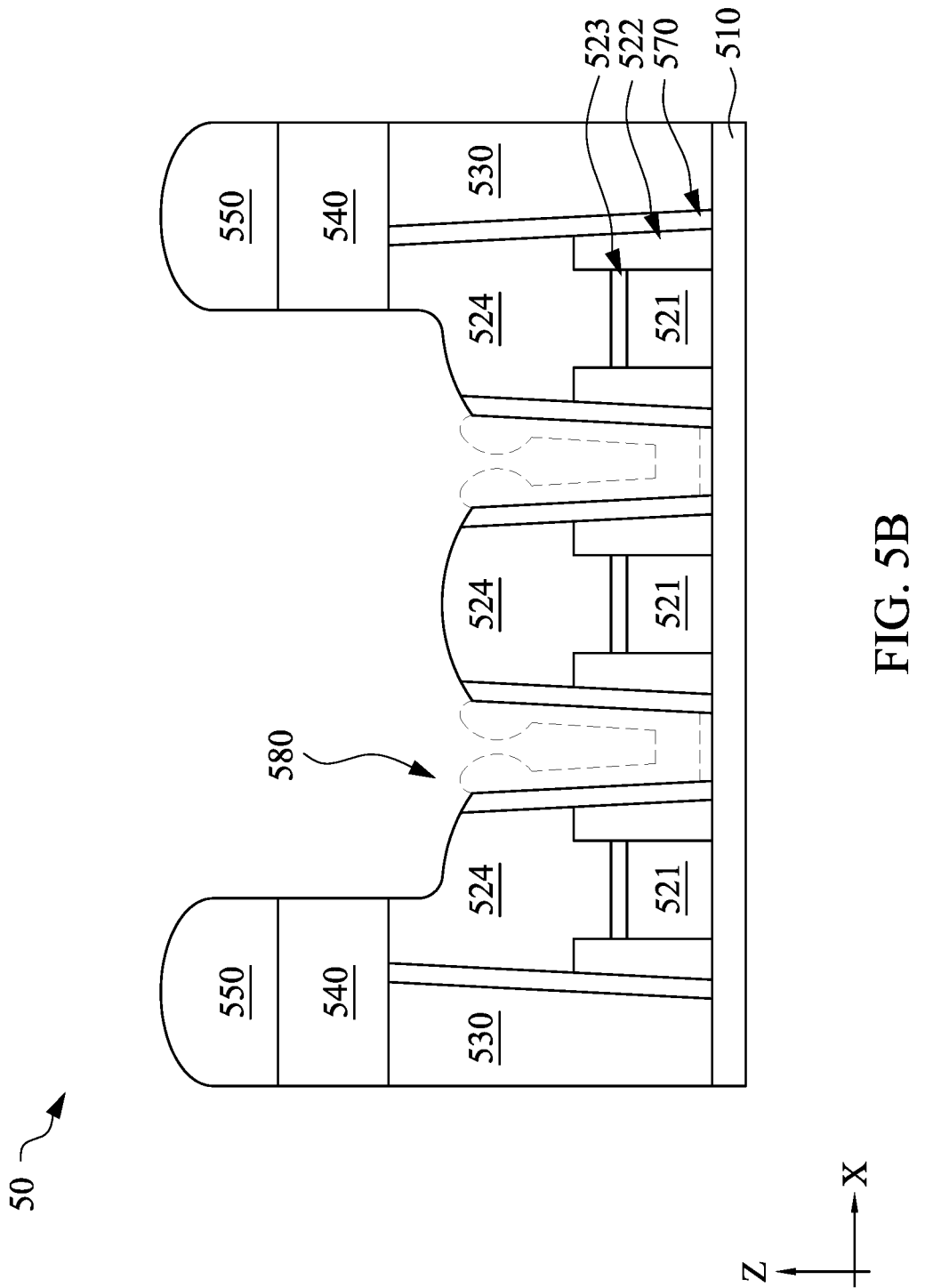

In FIG. 3C, the inner chamber 115 is released by retracting the sealing ring 178 and/or the upper portion 112, corresponding to operation 450 of the process 40 in FIG. 4A. With the inner chamber 115 released, a plasma operation, such as etching or deposition, is performed to process the wafer 105 using the gas(es) at the desired flow rate and the adjusted process parameters, corresponding to operation 460 of the process 40 in FIG. 4A. The plasma operation is performed with the wafer 105 exposed to the process chamber 110. As the desired flow rate is calibrated prior to the plasma operation, etching or deposition of materials on the wafer 105 may be performed with a highly accurate small gas flow, allowing for formation of features having smaller minimum dimension with greater yield. One such operation is illustrated in FIGS. 5A-5B. During the plasma operation, the spectral and/or charge monitoring system 180 may measure etching rate and/or perform real-time characterization of the plasma 125 by OES. The etching rate measurement performed by the spectral and/or charge monitoring system 180 during the plasma operation may be a real-time endpoint detection (EPD) operation, in some embodiments.

In FIGS. 5A-5B, a semiconductor device 50 in an intermediate stage of production is illustrated. In some embodiments, the semiconductor device 50 includes a plurality of transistors. In some embodiments, the transistors are fin-type field effect transistors (FinFETs), gate-all-around FETs (GAAFETs), or another type of transistor. In some embodiments, each transistor includes a gate electrode 521 overlying a semiconductor fin 510. In some embodiments, regions of the semiconductor fin 510 on either side of each gate electrode 521 are doped to form source/drain features (not separately labeled). Each gate electrode 521 is abutted on either side by a gate spacer 522. A hard mask 524 overlies each gate electrode 521. In some embodiments, an oxidation layer 523 is between each gate electrode 521 and the corresponding hard mask 524. An protection layer 570 overlies sidewalls of the hard mask 524 and gate spacer 522, as well as portions of the semiconductor fin 510 between the gate electrodes 521. A first dielectric layer 530, which may be an interlayer dielectric (ILD), laterally isolates the gate electrodes 521, and extends from the protection layer 570 or the semiconductor fin 510 to the upper surfaces of the hard mask 524 and the protection layer 570.

In the operation shown in FIGS. 5A-5B, a plasma-enhanced etching process 500 is performed on the semiconductor device 50. In some embodiments, the plasma-enhanced etching process 500 is consistent with the plasma operation described with reference to FIGS. 3A-3C and FIG. 4A. In some embodiments, the plasma-enhanced etching process 500 is performed using a flow rate of process and/or carrier gas(es) less than about 1 sccm, such as about 0.3 sccm to about 1 sccm, by the etching apparatus 100.

In some embodiments, the plasma-enhanced etching process 500 is performed to remove portions of a second dielectric layer 540 overlying the first dielectric layer 530, portions of the first dielectric layer 530 between the gate electrodes 521 and overlying the protection layer 570, and portions of the protection layer 570 between the gate electrodes 521 and overlying the semiconductor fin 510. In some embodiments, the plasma-enhanced etching process 500 includes multiple etching operations using different process conditions and process gases to remove the different materials of the second dielectric layer 540, the first dielectric layer 530, and the protection layer 570, without removing the material of the semiconductor fin 510. In some embodiments, a second hard mask 550 overlies the second dielectric layer 540, and the plasma-enhanced etching process 500 is performed through an opening in the second hard mask 550 that exposes the portions of the second dielectric layer 540, the first dielectric layer 530 and the protection layer 570. In some embodiments, a cap oxide layer 560 is over the second hard mask 550.

In FIG. 5B, following the plasma-enhanced etching process 500, the cap oxide layer 560 is removed, and the exposed portions of the second dielectric layer 540, the first dielectric layer 530 and the protection layer 570 are also removed. In the plasma-enhanced etching process 500, the protection layer 570 may be alternately removed and deposited in a sequence of etch/deposition cycles. In some embodiments, the protection layer 570 is a polymer. If the flow rate is too high during deposition or too low during etching, the protection layer 570 may build up, leading to overhang. If the flow rate is too low during deposition or too high during etching, the protection layer 570 may be consumed completely, leading to gradual loss of the hard mask 524 during etching. Dashed line 580 illustrates in phantom a typical etch profile consistent with use of an inaccurate flow rate, which is generally a problem below 1 sccm if the inner chamber 115 is not used to enhance matching prior to the plasma-enhanced etching process 500. The inaccurate (typically lower) flow rate is correlated with undesirable overhang from the protection layer 570 and insufficient etching depth in the first dielectric layer 530, leading to poor minimum dimension and/or defect performance, which is described in detail with reference to FIG. 6A. By using the etching apparatus 100 with improved gas flow rate control, the desired flow rate may be achieved with very low error rate, resulting in little or no overhang from the protection layer 570, improved etching depth through the entire first dielectric layer 530, and good contact between the source/drain regions and source/drain contacts formed in subsequent operations, which is described in detail with reference to FIG. 6B. As such, minimum dimension performance is improved, and rate of defects is reduced.

Figure 6A:
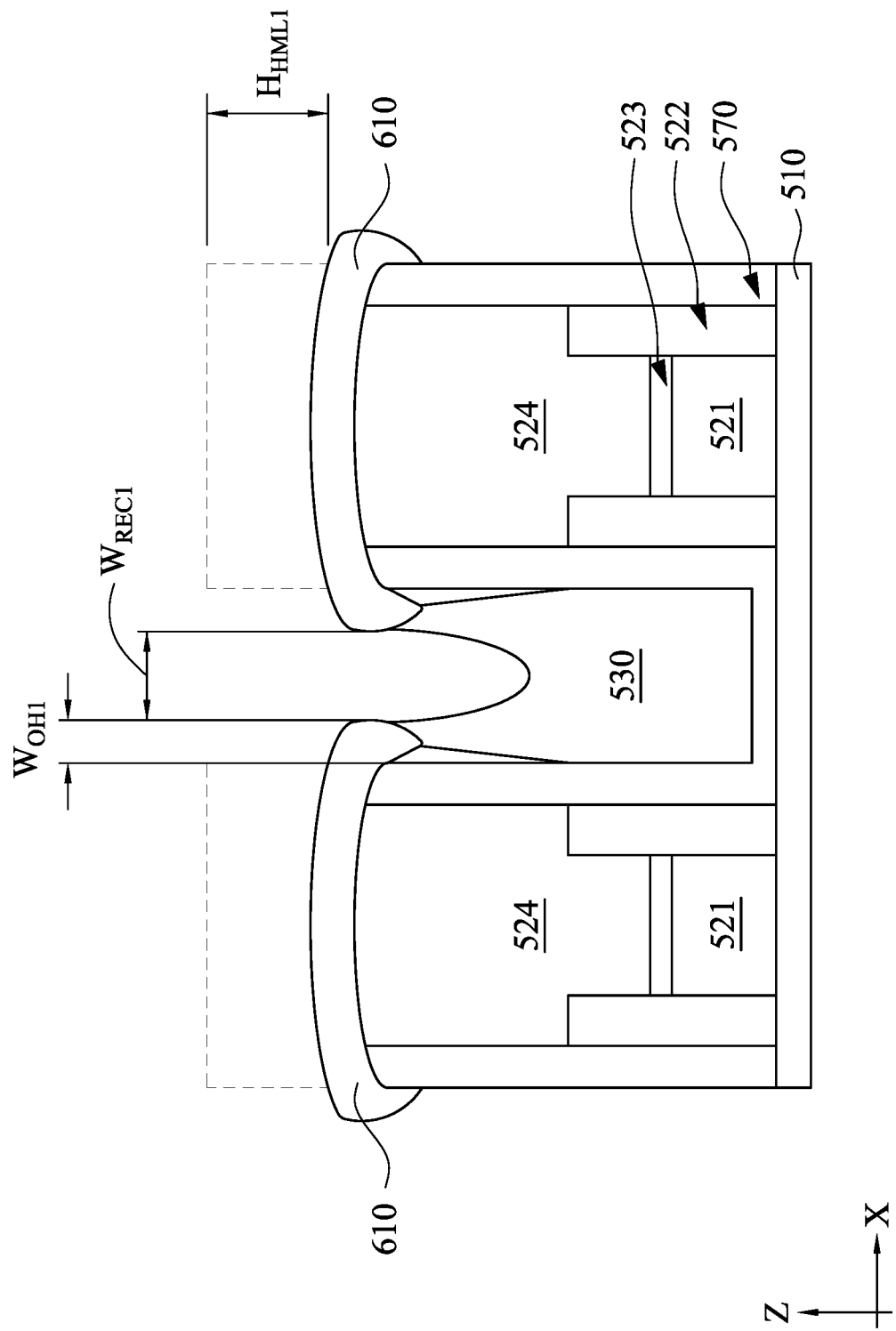
Figure 6B:
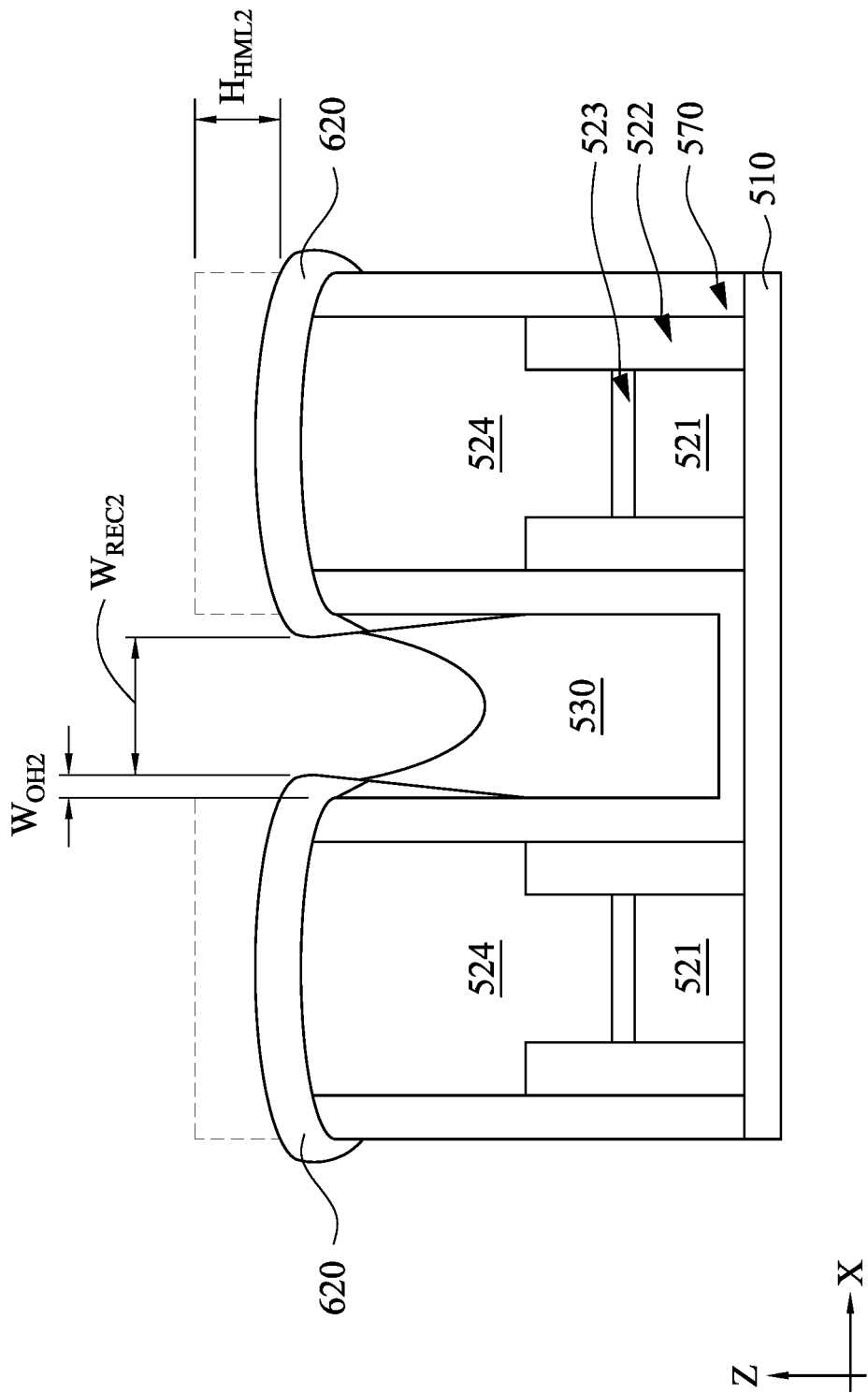

In FIG. 6A, an inaccurate flow rate results in a first recess width $W_{REC1}$, a first overhang width $W_{OH1}$ and a first hard mask loss height $H_{HML1}$. In FIG. 6B, an accurate flow rate results in a second recess width $W_{REC2}$, a second overhang width $W_{OH2}$ and a second hard mask loss height $H_{HML2}$. Due to the accurate flow rate, the second overhang width $W_{OH2}$ is less than the first overhang width $W_{OH1}$, such that the second recess width $W_{REC2}$ is greater than the first recess width $W_{REC1}$ by as much as 1 nm or more. The greater second recess width $W_{REC2}$ increases contact area, which lowers contact resistance. The second hard mask loss height $H_{HML2}$ is also less than the first hark mask loss height $H_{HML1}$, the difference there between being as much as 1 nm or more.

While the description of FIGS. 5A-6B is provided with relation to formation of source/drain contacts in a FinFET or GAAFET semiconductor device, in some embodiments, the plasma-enhanced etching process 500 may be utilized in many other process operations used to etch a variety of materials. In some embodiments, the plasma-enhanced etching process 500 is utilized in recessing a dielectric layer prior to source/drain epitaxy, replacing a dummy gate, forming interconnect line or via openings, or other suitable operations.

Embodiments may provide advantages. The etching apparatus 100 including the chamber confinement assembly allows for highly accurate, in-situ verification of gas flow rate using real conditions, such that the gas flow rate may be calibrated precisely prior to performing the plasma operation (etch or deposition) on a production wafer. As such, accurate minimum dimension control and low defect rate are achieved. Real-time OES detection and offline etch rate measurement are also provided by embodiments of the etching apparatus 100.

In accordance with at least one embodiment, a method comprises: forming an inner chamber in a process chamber of a plasma processing apparatus, the inner chamber having smaller volume than the process chamber; introducing at least one gas into the inner chamber; measuring flow of the at least one gas into the inner chamber; adjusting the flow of the at least one gas to a desired rate; and processing a wafer by the at least one gas at the desired rate while the inner chamber is not formed.

In accordance with at least one embodiment, a method comprises: shifting an upper portion of an etching apparatus vertically downward from a first position to a second position by an upper actuator; and shifting a sealing ring of a lower portion of the etching apparatus vertically upward from a third position to a fourth position by a lower actuator. While the upper portion is in the second position and the sealing ring is in the fourth position, the method further comprises: introducing at least one gas into the inner chamber; measuring at least two pressures of the inner chamber; and determining flow rate of the at least one gas based on the at least two pressures. A wafer is processed after the measuring while the upper portion is in the first position and the sealing ring is in the third position.

In accordance with at least one embodiment, an apparatus comprises a process chamber, an electrostatic chuck in the process chamber, a sealing ring in the process chamber and laterally surrounding the electrostatic chuck, and a chamber confinement assembly configured to shift position of the sealing ring vertically to establish an inner chamber in the process chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an inner chamber in a process chamber of a plasma processing apparatus, the inner chamber having smaller volume than the process chamber;
    introducing at least one gas into the inner chamber;
    measuring flow of the at least one gas into the inner chamber;
    adjusting the flow of the at least one gas to a desired rate; and
    processing a wafer by the at least one gas at the desired rate while the inner chamber is not formed.

2. The method of claim 1, wherein forming the inner chamber comprises:
    forming the inner chamber having about 10% to about 50% smaller volume than the process chamber.

3. The method of claim 1, wherein forming the inner chamber comprises:
    shifting position of a sealing ring surrounding an electrostatic chuck vertically toward an upper portion of the process chamber.

4. The method of claim 3, wherein shifting the position comprises:
    shifting the position of the sealing ring vertically until the sealing ring contacts at least an upper electrode of the upper portion.

5. The method of claim 1, further comprising:
    generating a plasma in the inner chamber while the inner chamber is present; and characterizing the plasma by a spectral and/or charge monitoring system outside the inner chamber.

6. The method of claim 5, further comprising:
forming adjusted process parameters for processing the wafer based on a result of the characterizing the plasma.

7. The method of claim 6, wherein processing the wafer comprises:
processing the wafer by the at least one gas at the desired rate and the adjusted process parameters while the inner chamber is not formed.

8. A method, comprising:
shifting an upper portion of an etching apparatus vertically downward from a first position to a second position by an upper actuator;
shifting a sealing ring of a lower portion of the etching apparatus vertically upward from a third position to a fourth position by a lower actuator;
while the upper portion is in the second position and the sealing ring is in the fourth position:
introducing at least one gas into an inner chamber formed between the upper portion and the sealing ring;
measuring at least two pressures of the inner chamber; and
determining flow rate of the at least one gas based on the at least two pressures; and
processing a wafer after the measuring while the upper portion is in the first position and the sealing ring is in the third position.

9. The method of claim 8, wherein shifting the sealing ring includes:
shifting a horizontal base portion in contact with the lower actuator; and
shifting a vertical extension in contact with the horizontal base portion and the sealing ring.

10. The method of claim 9, wherein shifting the sealing ring includes shifting the sealing ring by the lower actuator comprising a ball screw configured to be extended by a servo motor.

11. The method of claim 8, further comprising:
measuring characteristics of a plasma in the inner chamber by an optical emission spectrometer;
wherein the sealing ring comprises at least a portion aligned with the optical emission spectrometer, the portion being substantially transparent.

12. The method of claim 8, wherein inner diameter of the sealing ring is greater than diameter of an electrostatic chuck by less than about 0.1 millimeters.

13. The method of claim 8, further comprising:
while the upper portion is in the second position and the sealing ring is in the fourth position:
measuring at least two temperatures of the inner chamber corresponding to the at least two pressures;
wherein the flow rate is determined based on the at least two pressures and the at least two temperatures.

14. A method, comprising:
providing a wafer on an electrostatic chuck in a process chamber having a first volume;
forming an inner chamber in the process chamber by a sealing ring adjacent the electrostatic chuck, the inner chamber having second volume smaller than the first volume;
measuring flow of at least one gas into the inner chamber;
adjusting the flow of the at least one gas to a desired rate; and
processing the wafer by flowing the at least one gas at the desired rate into the first volume.

15. The method of claim 14, wherein the measuring flow is by a flow verification unit.

16. The method of claim 14, wherein a ratio of the second volume to the first volume is in a range of about 0.1 to about 0.5.

17. The method of claim 14, wherein the forming an inner chamber comprises:
shifting position of an upper portion of the process chamber vertically toward the sealing ring by a chamber confinement assembly.

18. The method of claim 17, wherein the chamber confinement assembly is further configured to shift the position of the sealing ring vertically to contact the upper electrode.

19. The method of claim 14, further comprising generating a plasma in the process chamber by supplying, by an upper electrode, radio frequency power.

20. The method of claim 19, further comprising measuring, by a spectral and/or charge monitoring system, at least one characteristic of the plasma in the inner chamber.

* * * * *